United States Patent [19]

Sasaki et al.

[11] Patent Number: 4,742,221
[45] Date of Patent: May 3, 1988

[54] OPTICAL COORDINATE POSITION INPUT DEVICE

[75] Inventors: Hiroaki Sasaki; Kazuo Hasegawa; Junichi Ouchi, all of Furukawa, Japan

[73] Assignee: Alps Electric Co., Ltd., Japan

[21] Appl. No.: 864,703

[22] Filed: May 19, 1986

[30] Foreign Application Priority Data

| May 17, 1985 | [JP] | Japan | 60-105327 |
| Aug. 2, 1985 | [JP] | Japan | 60-169690 |
| Sep. 12, 1985 | [JP] | Japan | 60-138685[U] |
| Sep. 4, 1986 | [JP] | Japan | 60-134394[U] |

[51] Int. Cl.$^4$ .............................................. G01V 9/04
[52] U.S. Cl. .................... 250/221; 250/222.1
[58] Field of Search ............ 250/221, 222.1, 216, 250/578, 237 R; 340/347 P

[56] References Cited

U.S. PATENT DOCUMENTS 3,764,813 10/1973 Clement et al. ............... 250/221
4,570,076 2/1986 Hamano et al. ............... 250/578
4,571,498 2/1986 Hagan et al. ............... 250/221

Primary Examiner—David C. Nelms
Attorney, Agent, or Firm—Guy W. Shoup

[57] ABSTRACT

An optical coordinate input device comprises a number of light emitting elements and corresponding light detecting elements disposed in a plurality of linear arrays. A light ray selection member is provided such that only the light rays from the light emitting elements are detected by the light detecting elements. The light ray selection member is an optical semiconductor element light obstructing holder. The optical semiconductor elements have terminals projecting from the bottom surface of their main body which are fixed to a base and have a light emitting function or light detection function. In addition to these, a pair of mold bodies extending in the array direction of the optical semiconductor elements is combined, and this array of elements can be integrally fitted therein while being provided with a pressure portion elestically contacting the bottom surface of the main body of each element.

5 Claims, 6 Drawing Sheets

OPTICAL COORDINATE POSITION INPUT DEVICE

FIELD OF INDUSTRIAL APPLICATION

The present invention relates to an optical detection type of coordinate position input device to be fitted in front of a display screen, and to detect and to input to a computer a coordinate position with respect to the display device.

BACKGROUND ART

Devices for inputting a coordinate position manually to a host computer include electromagnetic induction devices, electrostatic capacitance devices, transparent electrode devices, and optical detection devices. Of these the optical devices are receiving attention since they can be attached to the front of a display device, and simply by pressing an arbitrary point of the display device with a finger or the like, without connection to the detecting device, a particular coordinate position can be detected, and this provides reliability and operability.

A conventional example of this optical detection type of coordinate input device is shown in FIGS. 12 to 14. FIG. 12 is a perspective diagram showing the coordinate input device attached to the front of a display device, FIG. 13 shows a partial sectional view of the optical detecting element end, and FIG. 14 is a rear view of the internal construction of the coordinate input device with the rear cover removed. The coordinate input device is of roughly rectangular shape, and is principally constructed of a frame 1 with a central opening 2, a set of light emitting elements 4 such as LEDs and light detecting elements 5 such as phototransistors opposing each other on the edges of the reverse of the frame 1 or as shown in FIG. 12 on the side of the display screen 3a of the display device 3 which uses for example a CRT (cathode ray tube), and a calculation unit 6 which detects the position where the optical path between these sets of light emitting elements 4 and light detecting elements 5, and inputs to the host computer the coordinate position thereof.

Furthermore, in the opening 2 is provided an operating panel 2a formed of a VDT (video display terminal) filter, and by disposing this in front of the display screen 3a of the display device 3, and thereby dirt and dust are prevented from adhering to the screen 3a and the user's eyes are protected from strain. The light emitting elements 4 and the light detecting elements 5 have light emitting portions 4a and light detecting elements 5a fixed so as to be mutually facing to a base 7 attached to the frame 1. These light emitting elements 4 and light detecting elements 5 correspond to an area of the screen 3a for input use, and in order to detect only a particular operating area A, they are omitted from edge areas on each side so that the light paths do not intersect in the edge areas B. Furthermore on the front side of the light detecting portions 5a of the light detecting elements 5 is provided an optical baffle 8 in which are formed light transmitting apertures 8a of such a cross section and depth that the light from the corresponding light emitting element 4 can be received. Furthermore around the entire periphery of the apertures of the front of the optical baffle 8 and the front of the light emitting elements 4 is attached an infra-red filter 9 as a visible cutoff filter. Therefore on the side of the screen 3a of the operating panel 2a is established an optical path 12 not visible to the eye through the infra-red filter 9.

When a coordinate position is to be detected, as shown for example in FIG. 12 and FIG. 14, a finger 10 or the like is pressed from above the operating panel 2a at the position of the screen 3a to be input, whereupon since a light path 12 is established along the surface of the operating panel 2a, by scanning to energize the light emitting elements 4 in turn, in both the x direction and the y direction the obstructed light path 12 can be detected serially by the light detecting elements 5. Thus the obstructed light path 12 can be determined by the calculation unit 6, and the coordinate position can be output to a host computer not shown in the drawing.

PROBLEM TO BE SOLVED BY THE INVENTION

In this optical detection type of coordinate position input device, however, in order to prevent misoperation it is necessary for the light emitting elements 4 and light detecting elements 5 to be maintained at right angles to and at a fixed height above the base 7, and there is the problem with the conventional art described above that it is very difficult to obtain positioning precision in the fitting construction of the optical semiconductor elements 4 and 5. Since these optical semiconductor elements 4 and 5 are only held by one part of their terminals 4b and 5b to the base 7, when fitting it is easy for the main elements 4a and 5a to deviate, and therefore the angle of the light emitting portions and the light detecting portions tends to deviate from the correct value, and also since the bottom surface of the main elements 4a and 5a is uneven because of the potting, it is difficult to obtain height accuracy with respect to the base 7. As a result, the light emitted from the light emitting elements 4 deviates from the appropriate path, the light detecting elements 5 receive light they should not, that is to say from light emitting elements 4 other than the opposing ones, or reflected light from the opposing light emitting elements, such as light reflected from the surface of the visible cut off filter is detected, and thus errors are likely and thus the reliability is impaired. Furthermore, the installation of a multiplicity of these optical semiconductor devices 4 and 5 those positioning accuracy is difficult to obtain, makes manufacture more difficult and increases the burden of assembly work.

SUMMARY OF THE INVENTION

The present invention is made in consideration of the above points, and it has as its first technical objective the provision of an optical baffle for an optical semiconductor element such that positioning accuracy with respect to a base can be easily ensured when disposing optical semiconductor elements in a row, and misoperation can be prevented and workability improved.

In this optical detection type of coordinate position input device, however, in order to prevent misoperation it is necessary for the light emitting elements 4 and light detecting elements 5 to be maintained at right angles to and at a fixed height above the base 7, and there is the problem with the conventional art described above that it is very difficult to obtain positioning precision in the fitting construction of the optical semiconductor elements 4 and 5. Since these optical semiconductor elements 4 and 5 are only held by one part of their terminals 4b and 5b to the base 7, when fitting it is easy for the main elements 4a and 5a to deviate, and therefore for the angle of the light emitting portions and the light detecting portions to tend to deviate from the correct value, and also since the bottom surface of the main elements 4a and 5a is uneven because of the potting, it is difficult to obtain height accuracy with respect to the base 7. As a result, the light emitted from the light emitting elements 4 deviates from the appropriate path, the light detecting elements 5 receive light they should not, that is to say from light emitting elements 4 other than the opposing ones, or reflected light from the opposing light emitting elements, such as light reflected from the surface of the visible cut off filter is detected, and thus errors are likely and thus the reliability is impaired.

The present invention is made in consideration of the above points, and it has as its second technical objective the provision of a light obstructing holder for an optical semiconductor element such that positioning accuracy of the optical semiconductor element with respect to a base can easily ensured.

Furthermore, both the light emitting elements and the light detecting elements are ranked by their characteristics, and one rank is used to manufacture a product, but even within one rank there is some fluctuation of characteristics from one item to another, and setting the threshold level is difficult and signal processing is problematic.

Therefore conventionally elements showing a large signal value are replaced, but this exchange operation is extremely burdensome because for example the element has been soldered to the base.

The present invention has as its third technical objective the provision of an output adjusting method for elements in an optical array which solves the above mentioned problems with the prior art, whereby the light amount of each element may be simply change and fluctuations in characteristics removed, and a uniform signal output obtained.

Furthermore, in this age of ever increasing information, there is a strong call for an expansion of the operating area A with respect to the screen 3a, and with this call it has become necessary to provide the light emitting elements 4 and light detecting elements 5 extending to the limits of each edge portion B. However, if the operating area A is extended to the corners of the opening 2 and light emitting elements 4 and light detecting elements disposed correspondingly, then there will be detection errors by the light detecting elements 5 in the extreme positions B of each edge, and new problems will be created. This is considered to be because as the operating area A is expanded so that the matrix produced by the light paths of the light emitting elements 4 and light detecting elements 5 is extended to the entire area of the screen 2a, then associated with the improvement in recent years of the sensitivity of the light detecting elements 5, light from the extremity of the optical baffle 8 has penetration and refraction phenomena which cause a light amount such as to produce more than a certain level output impinges on the light detecting elements 5 disposed at the extremities.

That is to say that conventionally the infra-red filter 9 alongside the emitted light is separated from the light detecting elements 5 and the light emitting elements 4, but with the enlargement of the matrix this distance is lessened and therefore the result is that light rays impinging from the corners of the infra-red filter 9 circulate internally and are detected by the elements disposed at the extremities of the array of light detecting elements 5.

The present invention is made in consideration of the above mentioned phenomena in the conventional art and has as its fourth technical objective the provision of a coordinate input device in which coordinate position detection errors do not occur as a result of light penetration or leakage.

MEANS OF SOLVING THE PROBLEM

In order to solve the first to the fourth technical objectives above, the present invention is characterised by being an optical detection method coordinate input device having a plurality of arrays in which light emitting elements and corresponding light detecting elements are disposed linearly and provided with a light ray selection member such that only the light rays from said light emitting elements are detected by said light detecting elements.

In order to solve the first technical objective above, the present invention is characterised in that the above-mentioned light ray selection member has an optical semiconductor element light obstructing holder which is such that the optical semiconductor elements have terminals projecting from the bottom surface of their main body which are fixed to a base and have a light emitting function or light detecting function and are disposed in linear pluralities on said base, whereby a pair of mold bodies extending in the array direction of said optical semiconductor elements is combined, this array of elements can be integrally fitted therein, and is provided with a pressure portion elastically contacting the bottom surface of the main body of each element, a container portion containing the main body of each element, and a light transmitting aperture positioned at the front side of each element.

Said light obstructing holder has the characteristic that it it is an optical semiconductor element light obstructing holder provided within the diameter of said light transmitting aperture with an enlargement portion formed with a greater diameter than the diameter of the entry portion of the light transmitting aperture and restricting the light impinging direction.

In order to solve the second technical objective above, the present invention is characterised in that the light ray selection member has an optical semiconductor element light obstructing holder which is provided with optical semiconductor elements having terminals projecting from the bottom surface of their main body which are fixed to a base and have a light emitting function or light detecting function characterised in that the optical semiconductor elements can be integrally fitted therein, and in being provided with a foot portion supporting elastically the bottom surface of the main body of the elements, a container portion containing the main body of each element, and a light transmitting aperture positioned at the front side of each element.

In order to solve the third technical objective above, the present invention is characterised in that the light ray selection member is an element output adjustment method in which a plurality of types of cap of differing transparent window diameter are provided and while the elements are disposed in an optical array a cap of the desired diameter is put over only those of a large signal output whereby the light level of the elements is made uniform.

In order to solve the fourth technical objective above, the present invention is such that the light ray selection member has a light obstructing member being an optical detection method coordinate input device such that an array of light emitting elements and a corresponding array of light detecting elements are provided, light paths are formed between these light emitting members and light detecting members making a plurality of intersections at the front side of the screen of a display device and a coordinate position on the screen is determined by detecting a position at which the light path is obstructed, and this position is input, characterised by being for the purpose of preventing light penetration to the light detecting elements at least in the corner portion of the frame adjacent to said light detecting element array.

EFFECT

The above technical means have the following effect. The light rays emitted by the light emitting elements are admitted by the light ray selection member only to the corresponding light detecting elements.

The means for solving the first technical objective has the effect that an optical semiconductor element light obstructing holder is adopted of a construction whereby a pair of mold bodies extending in the array direction of said optical semiconductor elements is combined, this array of elements can be integrally fitted therein, and provided with a pressure portion elastically contacting the bottom surface of the main body of each element, a container portion containing the main body of each element, and a light transmitting aperture positioned at the front side of each element, and this light obstructing holder combines the function of an optical baffle used in a conventional coordinate input device and the function of guaranteeing the positioning of an array of optical semiconductor devices with respect to the base.

The means for solving the second technical objective has the effect that an optical semiconductor element light obstructing holder is adopted of a construction whereby the semiconductor elements can be integrally fitted therein, and provided with a foot portion supporting elastically the bottom surface of the main body of the elements, and a light transmitting aperture positioned at the front side of each element, and this light obstructing holder combines the function of an optical baffle used in a conventional coordinate input device and the function of guaranteeing the positioning of an array of optical semiconductor devices with respect to the base.

The means for solving the third technical objective has the effect that a plurality of types of cap of differing transparent window diameter are provided and while the elements are disposed in an optical array a cap of the desired diameter is put over only those of a large signal output whereby the light level of the elements is made uniform.

The means for solving the fourth technical objective has the effect that in an optical detection method coordinate input device in which a matrix of light paths is formed between an array of light emitting elements and a corresponding array of light detecting elements, the position at which these light paths are obstructed is detected, and a coordinate position on the screen is determined, and this position is input to a computer, a light obstructing member is provided in the corner portion of a frame adjacent to the light detecting elements, preventing light penetration from the corner of an infra-red filter, and preventing erroneous detection by the light detecting elements close to the corner portion.

In these drawings 4 is a light emitting element, 4a a main body, 4b a terminal, 5 a light detecting element, 5a a main body, 5b a terminal, 7 a base, 112 a light obstructing holder, 112a a light transmission aperture, 112b a light impinging direction restricting cavity, 112c a container portion, 13 a lower mold, 13a a step, 13b a pressure portion, 14 an upper mold, and 14a a projection.

Figure 3:
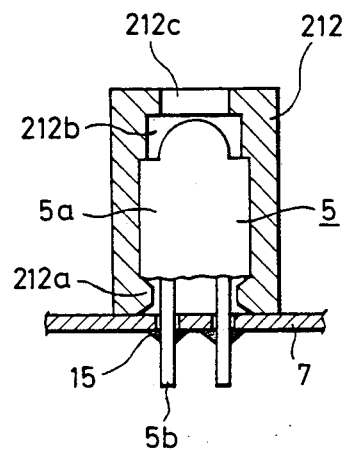
Figure 4:
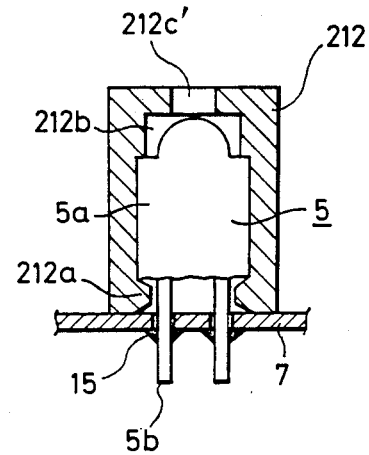
Figure 5:
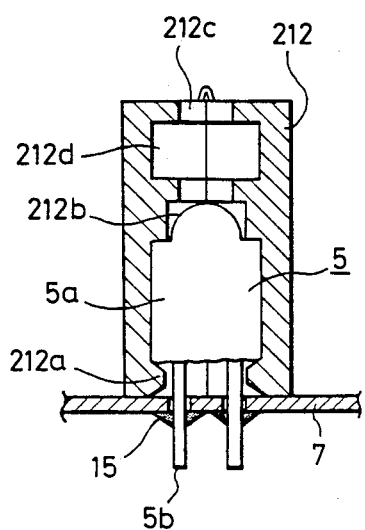
Figure 6:
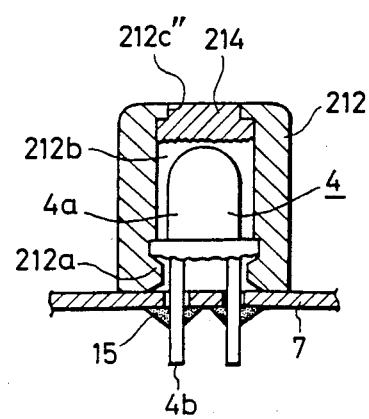

FIGS. 3 to 6 show a second embodiment of a light obstructing holder according to the present invention, FIG. 3 being a section of a first embodiment thereof, FIG. 4 being a section of a second embodiment thereof, FIG. 5 being a section of a third embodiment thereof, and FIG. 6 being a section of a fourth embodiment thereof.

In these drawings 4 is a light emitting element, 4a a main body, 4b a terminal, 5 a light detecting element, 5a a main body, 5b a terminal, 7 a base, 212 a light obstructing holder, 212a a foot portion, 212b a container portion, 212c, 212c' and 212c'' light transmission apertures, 212d a light impinging direction restricting cavity and 214 a fresnel lens.

Figure 7:
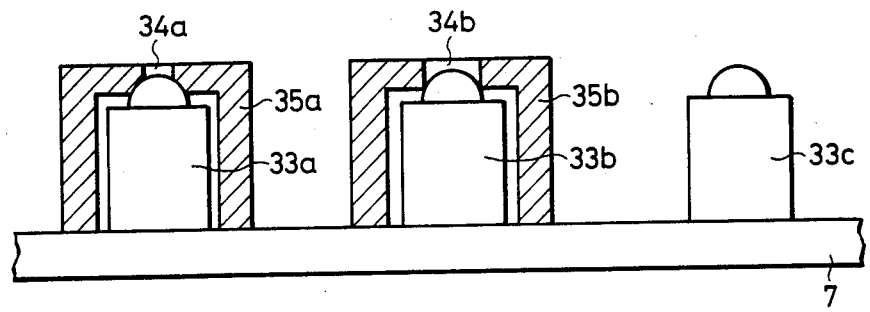
Figure 8:
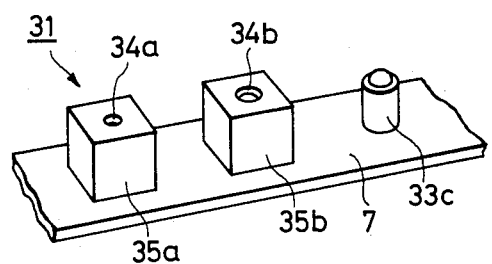

FIG. 7 and FIG. 8 show an optical array being a third embodiment of the present invention, FIG. 7 being a partial section of the optical array and FIG. 8 a partial perspective view of FIG. 7.

In these drawings 31 is an optical array, 7 a base, 33a, 33b and 33c elements, 34a and 34b light windows, and 35a and 35b caps.

Figure 1:
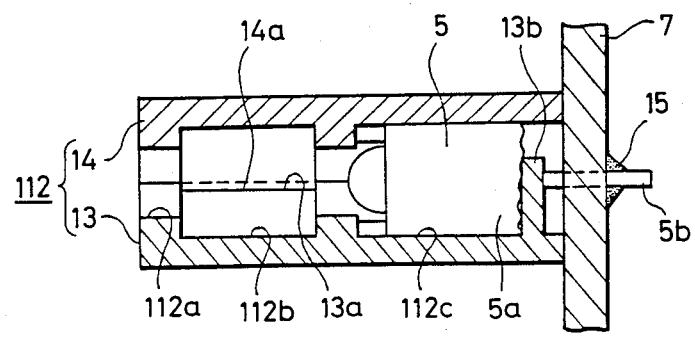
FIG. 1 and FIG. 2 show a first embodiment of a light obstructing holder according to the present invention, FIG. 1 being a section thereof and FIG. 2 a partial perspective view.
Figure 9:
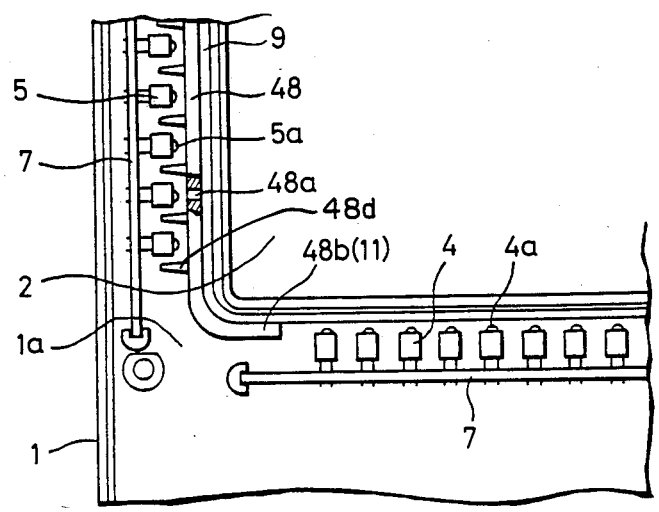
Figure 10:
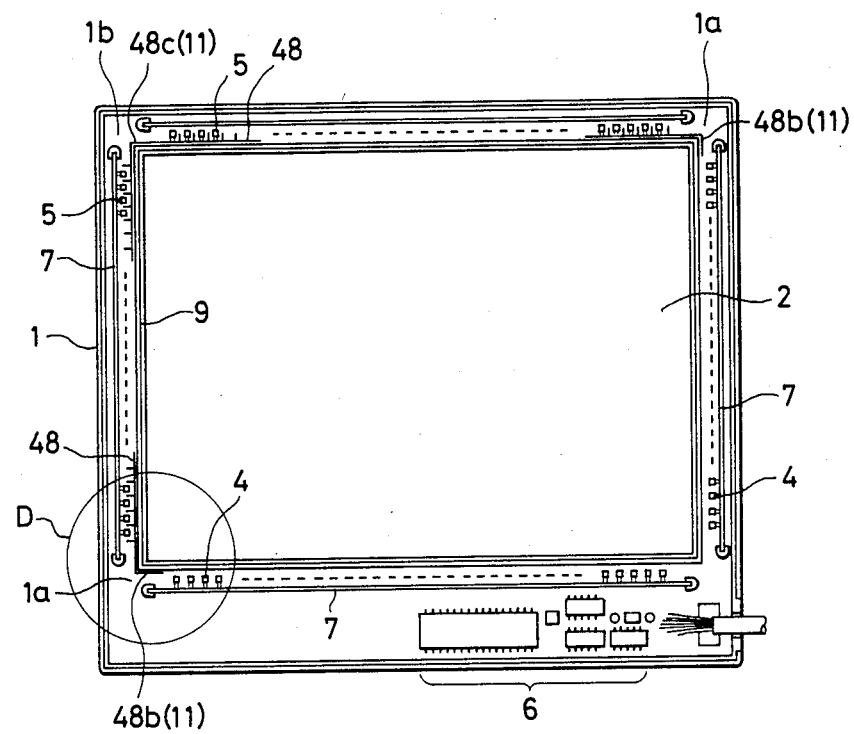
Figure 11:
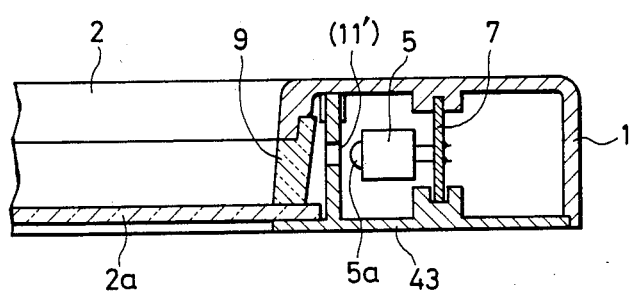
Figure 12:
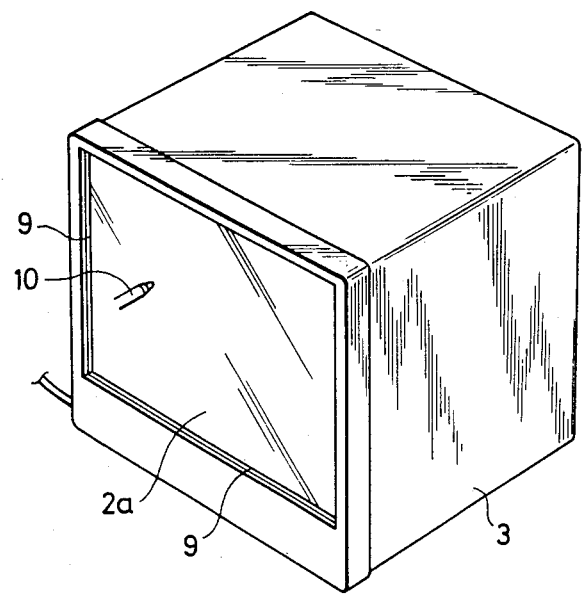
Figure 13:
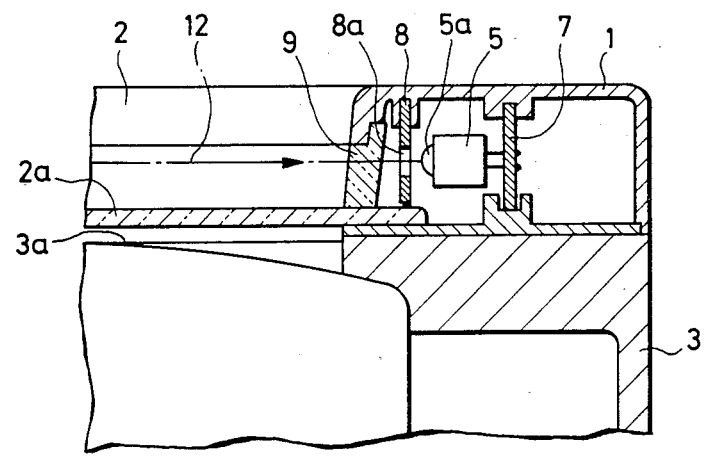
Figure 14:
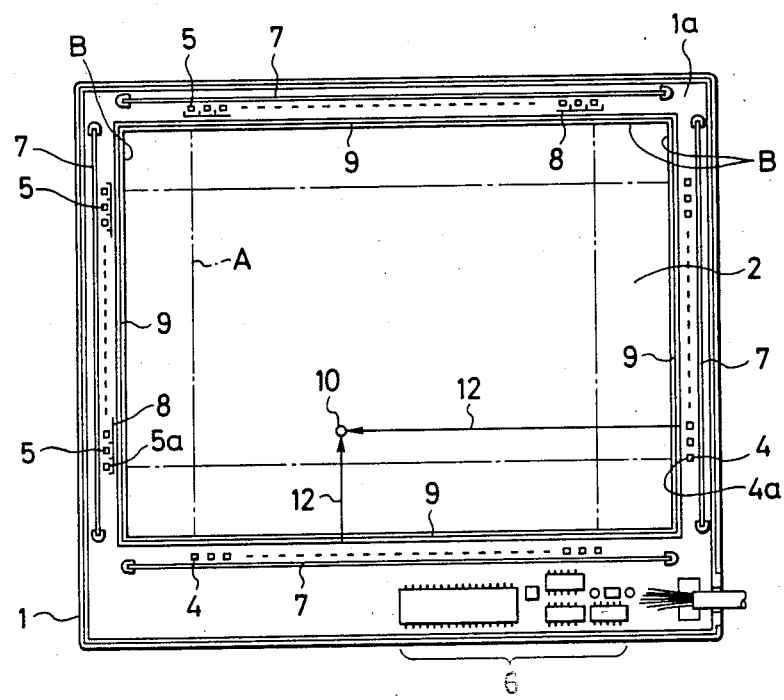

FIG. 9 and FIG. 10 show a coordinate input device being a fourth embodiment of the present invention, FIG. 1 being an enlargement of the portion D of FIG. 10, FIG. 10 being a schematic rear view showing the internal construction of the coordinate input device, FIG. 11 being a partial section of another embodiment thereof, and FIGS. 12 to 14 illustrate the prior art, FIG. 12 being a perspective view of a coordinate input device attached to the front of a display device, FIG. 13 being a partial section showing the internal construction, and FIG. 14 being a rear view showing schematically the internal construction.

In these drawings 1 is a frame, 1a and 1b corners, 3 a display device, 3a a screen, 4 is a light emitting element, 5 a light detecting element, 48 an optical baffle, 48b and 48c edge portions, (11) and (11') light obstructing members, and 12 a light path.

DESCRIPTION OF THE PREFERRED EMBODIMENTS

The present invention is now described in detail in terms of the embodiments shown in FIGS. 1 to 11.

Figure 2:
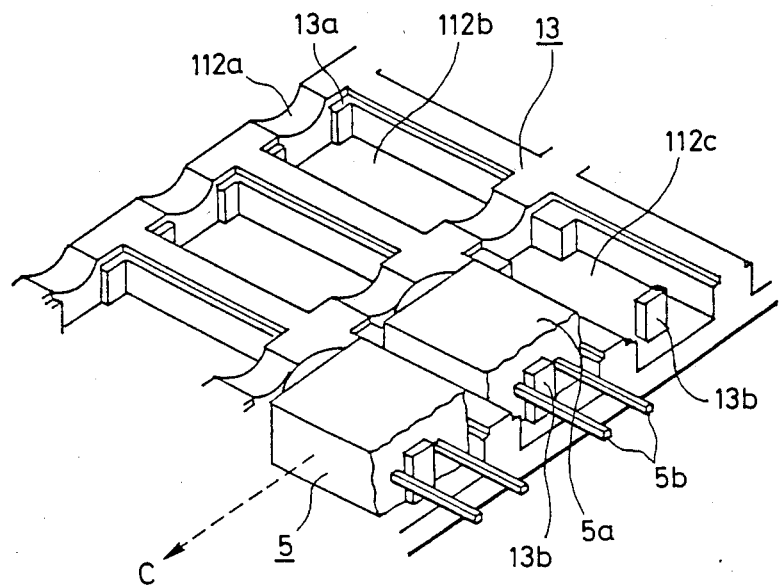

FIG. 1 is a sectional diagram of a first embodiment being a light obstructing holder being a light ray selection member, and FIG. 2 is a partial perspective view thereof, and numeral 5 represents a light detecting element, 7 is a base, 112 is the whole of a light obstructing holder, 13 is a lower mold thereof, 14 is an upper mold thereof, and 15 is solder.

In these drawings, the light obstructing holder 112 is formed of polyacetal or the like, and comprises a lower mold 13 and upper mold 14 in combination, which extend in the direction of the line in which the light detecting elements 5 are arranged (the direction of arrow C in FIG. 2); after the plurality of light detecting elements 5 is inserted within the rear portion of the lower mold 13 as shown in FIG. 2, by forcibly engaging a projection 14a on the upper mold 14 with a step 13a on the lower mold 13, the light obstruction characteristic is ensured while the array of light detecting elements 5 is made integrally fittable. Then with the light detecting elements 5 fitted, a light transmission aperture 112a at the forward end of the light obstructing holder 112, an impinging direction restricting cavity 112b being an enlarged portion formed with a diameter larger than that of the entry portion of the light transmission aperture 112a at the rear of the light transmission aperture 112a, and a container portion 112c at the rear of the impinging direction restricting cavity 112b are respectively formed; the main bodies 5a of the light detecting elements 5 are inserted into the container portions 112c and the pressure portion 13b projecting from the lower mold 13 press elastically on the lower surface of the main bodies 5a. In other words the light detecting elements 5 engaging with the light obstructing holder 12 are elastically pressured on the bottom surface of the main bodies 5a by the pressure portion 13b, so that when the terminals 5b are attached by solder 15 the height accuracy with respect to the base 7 is ensured, and the main bodies 5a held within the container portion 112c whose perpendicularity to the base 7 is ensured are also necessarily maintained perpendicular to the base 7, and the positioning accuracy is markedly improved. Further, the light transmission aperture 112a at the forward side of the main body 5a of each light detecting element 5 has a fixed area and depth, and has the same function as the light transmission aperture of an optical baffle used in a conventional coordinate input device so that such an optical baffle is not required.

Thus merely by insertion into the light obstructing holder 112 the positioning accuracy with respect to the base 7 of the light detecting elements 5 arranged in an array is automatically ensured, whereby not only can erroneous operation be positively prevented, but also the assembly operation is simplified.

The light impinging direction restricting cavity 112b formed as an enlargement portion between the light transmission aperture 112a and the container portion 112c is larger than the light transmission aperture 112a, and because of this light impinging direction restricting cavity 112b that of the light impinging on the light transmission aperture 112a which is not desired, that is to say all but the light impinging from the light emitting element corresponding to the light detecting element 5 within the container portion 112c, does not reach the detecting portion at the front edge of the main body 5a of the light detecting element 5. Therefore, the light detected by the detecting portion of the light detecting elements 5 is severely restricted in its impinging direction and only the impinging light coming from the desired light emitting element will be detected, whereby erroneous operation is even more positively prevented.

If the walls of the impinging light direction restricting cavity 112b are subjected to an antireflection treatment the effect of preventing unwanted impinging light will be made yet more effective.

Also, in the above embodiment, the case is described that a pressure portion 13b is provided only in the lower mold 13 of the light obstructing holder 112, but the pressure portion may be provided in the upper mold 14.

In the above embodiment, the light obstructing holder 112 is formed by a pair of separate molds being a lower mold 13 and an upper mold 14, but a hinge portion may be formed in the shape of the light transmission aperture 112a and the lower mold 13 and upper mold 14 formed integrally through this hinge portion, after arranging the optical elements in the prescribed position, bent about the hinge portion and the matching lower mold portion and upper mold portion engage, and the light obstructing holder containing the optical elements thus formed. Further, a light transmission aperture 112a forming portion provided with an impinging light restricting cavity 112b may be formed separately and disposed at the front of the light obstructing holder formed by the above pair of molds, or in other words at the front of the detecting portion of the light detecting elements 5.

FIG. 3 is a sectional view showing a second embodiment of the present invention, being a light obstructing holder which is a light ray selection member, FIG. 4 is a sectional view of another embodiment of FIG. 3, FIG. 5 is a sectional view of yet another embodiment of FIG. 3, and FIG. 6 is a sectional view of another embodiment of FIG. 5, and with regard to portions explained in the prior art and in FIG. 1 and FIG. 2 and for portions having the same functions, the same reference numerals are used, and detailed description is omitted.

In the drawings, the numeral 5 indicates a light detecting element, 7 a base, 212 a light obstructing holder, and 15 solder.

In FIG. 3, the light obstructing holder 212 is formed of such as polyacetal, and comprises a pair of non transparent half bodies being hingingly coupled and able to be opened and closed, and having an appropriate elasticity, and after these have been opened out and the light detecting elements 5 inserted, the two halves are mutually engaged, and the light detecting elements 5 are integrally fittable therein. Thus with the light detecting elements 5 fitted, the foot portion 212a at the rear end of the light obstructing holder 212 presses elastically against the bottom surface corner of the main body 5a of the light detecting element 5, the main body 5a of the light detecting element 5 is contained in the container portion 212b of the light obstructing holder 212, and the light transmission aperture 212c is at the front end (in front of the light detecting portion) of the main body 5a of the light detecting element 5. In other words when the light detecting elements 5 are fitted into the light obstructing holder 212, the bottom surface corner portion of the main body 5a bears elastically on the foot portion 212a, as a result when the terminals 5b are attached by solder 15 the height accuracy with respect to the base 17 is ensured, and the main body 5a fitted within the container portion 212b whose perpendicularity to the base 7 is ensured as also necessarily maintained perpendicular to the base 7, and the positioning accuracy is markedly improved. Further, the light transmission aperture 212c at the forward side of the main body 5a of each light detecting element 5 has a fixed area and depth, such that light can be detected only from the light emitting element corresponding to the element 5, and thus the optical baffle used in a conventional coordinate input device is rendered unnecessary. In this embodiment, instead of a hinge, the form can be formed completely integrally, and the insertion done from the top.

In the embodiment of FIG. 4, the area of the light transmitting aperture 212c' of the light obstructing holder 212 is different from the previous embodiment, and by changing the area or depth of the light transmitting aperture 212c' when forming the light obstructing holder 212 the light amount may be adjusted to an arbitrary value.

The embodiment of FIG. 5 differs from previous embodiments in that between the light transmission aperture 212c and the container portion 212b is formed an impinging light direction restricting cavity 212d, being a cavity larger than the light transmission aperture 212c. That is, by means of this impinging light direction restricting cavity 212d, it is arranged that that of the light impinging on the light transmission aperture 112a which is not desired, that is to say all but the light impinging from the light emitting element corresponding to the light detecting element 5 within the container portion 212b, is excluded and does not reach the detecting portion at the front edge of the main body 5a of the light detecting element 5. Therefore, the light detected by the detecting portion of the light detecting elements 5 is severely restricted in its impinging direction and only the impinging light coming from the desired light emitting element will be detected, whereby erroneous operation is even more positively prevented. This example differs from the previous two examples in that the form cannot be formed completely integrally, but by a hinge connection or two engaging parts, the required form can be obtained.

If the walls of the impinging light direction restricting cavity 212b are subjected to an antireflection treatment the effect of preventing unwanted impinging light will be made yet more effective.

In the embodiment of FIG. 6, a fresnel lens 214 is fitted into the light transmitting aperture 212c'' of the light obstructing holder 212 used in the light emitting element 4 and by means of this fresnel lens 214 the directionality of the light emitted from the light emitting portion of the front of the main body 4a of the light emitting element 4 is ensured.

FIG. 7 is a third embodiment of the present invention, and shows a section of a light obstructing holder being a light ray selection member, FIG. 8 is a perspective view of FIG. 7, and with regard to portions explained in the prior art and in FIG. 1 to FIG. 6 and for portions having the same functions, the same reference numerals are used, and detailed description is omitted.

In the drawings, 31 is an optical array, and this optical array 31 comprises elements such as phototransistors or LEDs 33a, 33b, 33c, . . . , spaced apart at a fixed interval on a base 7. Of these elements 33a, 33b, 33c, . . . if it is supposed that 33a has the largest output signal, and then 33b, 33c and so on, then it will be necessary to restrict the light amount of the elements 33a and 33b to be the same as 33c, and thus make uniform the output signals of the elements 33a, 33b, 33c, . . . and so on, and therefore as a means for this light amount control, caps 35a and 35b . . . in the top surfaces of which are formed light windows 34a, 34b, . . . are put (over elements 33a, 33b, . . . correspondingly. These caps 35a, 35b, . . . have light windows 34a, 34b, . . . of different diameters corresponding to the control amount, and the light window 34a is smaller than 34b.

When this optical array 31 is embodied in an optical coordinate input device it will be effective to use the caps 35a, 35b, . . . on the side of the phototransistors, but by also employing them on the side of the LEDs the adjustment level will be upped yet further.

FIG. 9 is a fourth embodiment of the present invention, and shows a rear portion of an optical coordinate input device showing the disposition of an optical baffle being a light ray selection member, FIG. 10 is a rear view showing FIG. 9 in total, FIG. 11 is a partial section showing another construction of the optical baffle, and with regard to portions explained in the prior art and in FIG. 1 to FIG. 8 and portions having the same functions, the same reference numerals are used, and detailed description is omitted.

In FIG. 9 and FIG. 10, edge portions 48b and 48c of an optical baffle 48 mounted on a frame 1 on the front side of the light detecting elements 5 extend on both sides as a light obstructing member (11). At the corner portion 1a, the light emitting elements 4 near the side of the edge portion 48b may emit light which is scattered toward light receiving elements 5. The baffle 48 has blocking portions 48d which prevent the ingress of light from the corner portion 1a of the frame 1. Correspondingly, the edge portion 48c on the side adjacent to the light detecting element 5 is bent integrally, and the blocking portions 48d blocks light from the corner portion 1a. Otherwise portions not explicitly explained are of the same construction as said prior art.

As described above, the edge portions 48b and 48c of the optical baffle 48 extend to the corner portions 1a and 1b of the opening 2 of the frame 1, and function as a light obstructing member 11, whereby the ingress of light to the light detecting elements 5 can be prevented. Therefore, there is no longer the danger that light other from the prescribed path 12 would impinge on the light detecting elements 5 producing an unintended output whereby coordinate detection becomes impossible or an error is produced, and an output is obtained in one to one correspondence with the indicated points.

The optical baffle 48 relating to this embodiment is shown by way of example as attached to the frame 1, but a light obstructing member (11') is not necessarily formed on the side of the frame 1, but for example as shown in FIG. 11, the same effect may be obtained by integral formation projecting from the back plate 43, or for example the light obstructing member may be formed by a signal cable connecting the light emitting elements 4 and the light detecting elements 5 or it is possible for the corner portions 1a and 1b to be closed by an elastic opaque body having a light obstructing function.

BENEFIT

According to the invention of the first embodiment a light obstructing holder is adopted in which can be fitted integrally arrays of light emitting elements and light detecting elements, whereby the perpendicularity and height accuracy of these optical semiconductor elements with respect to a base can be easily ensured, and when the light obstructing holder is fitted with a light detecting element array the optical baffle used in a conventional coordinate input device can be rendered unnecessary, and therefore the operability and reliability is substantially improved.

According to the invention of the second embodiment a light obstructing holder is adopted provided with light emitting elements or light detecting elements, such that these optical semiconductor elements can be fitted integrally therein, whereby the perpendicularity and height accuracy of these optical semiconductor elements with respect to a base can be easily ensured and erroneous operation positively prevented, and whereby when the light obstructing holder is fitted with light detecting elements the optical baffle used in a conventional coordinate input device can be rendered unnecessary.

According to the invention of the third embodiment, the characteristics of the elements provided in the optical array are made uniform by means of the light window of caps, and therefore threshold setting is easy, and signal processing is made simple, and the burdensome task of the convention element replacement is completely eliminated.

According to the invention of the fourth embodiment, a light obstructing member preventing unintended light from circulating behind the optical baffle and impinging on a light detecting element is provided at the corners of the frame where conventionally an optical baffle was not provided, whereby since only light passing along a prescribed path can be detected the danger of detection errors is removed, and a coordinate input device can be provided adequately responding to an enlargement of the operating area.

Although the present invention has been shown and described in terms of certain preferred embodiments thereof, and with reference to the appended drawings, it should not be considered as being particularly limited thereby. The details of any particular embodiment, or of the drawings, could be varied without, in many cases, departing from the ambit of the present invention. Accordingly, the scope of the present invention is to be considered as being delimited, not by any particular perhaps entirely fortuitous details of the disclosed preferred embodiments, or of the drawings, but solely by the legitimate and properly interpreted scope of the accompanying claims, which follow.

What is claimed is:

1. An optical coordinate input device comprising: a plurality of light emitting elements arranged in a row; a plurality of light receiving elements arranged in a row opposite the row of light emitting elements so as to form a plurality of light rays from each light emitting element to each corresponding light receiving element;

a holding frame for shielding and holding said row of light receiving elements in proper alignment to receive light from the corresponding light emitting elements, said frame being formed by a front wall having a plurality of light receiving openings each for receiving light ray from a corresponding light emitting element, a row of containing cavities in an interior portion of the frame in back of said front wall wherein a respective light receiving element is inserted in each one of said cavities, and a plurality of pressing portions projecting from a rear wall of said frame each for elastically pressing a rear part of a respective light receiving element into a corresponding cavity so that it is integrally fitted therein for proper alignment of the light receiving element; and a circuit substrate mounted on the rear wall of said holding frame for electrically connecting respective terminals from each of the light receiving elements to an operating circuit.

2. An optical coordinate input device according to claim 1, wherein said frame further includes a plurality of light restricting cavities provided between said light receiving openings in said front wall and said row of light receiving elements in said containing cavities, wherein each light restricting cavity extends along an optical axis of the respective light receiving element and has a width wider than a width of the corresponding light receiving opening for containing spurious light other than the corresponding light ray.

3. An optical coordinate input device according to claim 1, wherein said frame is formed by two molded plastic frame halves, each having respective halves of said light receiving openings and said containing cavities, and said pressing portions are molded projecting perpendicularly from one of said frame halves.

4. An optical coordinate input device according to claim 1, further comprising a plurality of caps each provided over a respective one of said light emitting elements, said caps each having a light emitting opening having a diameter which is varied in accordance with the light output of the corresponding light emitting element so that the output light rays of the elements are made uniform.

5. An optical coordinate input device comprising:

a plurality of light emitting elements arranged in a two rows perpendicular to each other;

a plurality of light receiving elements arranged in two rows perpendicular to each other opposite the respective rows of light emitting elements so as to form a matrix of light rays from each light emitting element to each corresponding light receiving element;

a holding frame for shielding and holding said rows of light receiving elements in proper alignment to receive light from the corresponding light emitting elements, said frame being formed by a front wall having a plurality of light receiving openings disposed in front of the light receiving elements each for a receiving light ray from a corresponding light emitting element, said front wall having bent edge portions which extend around corner portions of said frame toward respective sides of said rows of light emitting elements, and a row of light blocking portions extending perpendicularly from said front wall along each side of each of the light receiving elements, said front wall edge portions and said blocking portions being provided so as to shield said light receiving elements from spurious light scattered from the light emitting elements in a sidewards direction around the corner portions of said frame.

* * * * *